(12) United States Patent
Choi et al.

(10) Patent No.: US 11,322,613 B2
(45) Date of Patent: May 3, 2022

(54) STRUCTURE AND OPERATION METHOD OF TRANSISTOR ACTING AS A NEURON IN NEUROMORPHIC SYSTEM, AND A NEUROMORPHIC SYSTEM USING IT

(71) Applicant: Korea Advanced Institute Of Science And Technology, Daejeon (KR)

(72) Inventors: Yang-Kyu Choi, Daejeon (KR); Joonkyu Han, Daejeon (KR)

(73) Assignee: Korea Advanced Institute Of Science And Technology, Daejeon (KR)

( * ) Notice: Subject to any disclaimer, the term of this patent is extended or adjusted under 35 U.S.C. 154(b) by 66 days.

(21) Appl. No.: 16/896,346

(22) Filed: Jun. 9, 2020

(65) Prior Publication Data
US 2020/0388705 A1  Dec. 10, 2020

(30) Foreign Application Priority Data

Jun. 10, 2019  (KR) .................. 10-2019-0067919
Jun. 5, 2020  (KR) .................. 10-2020-0067970

(51) Int. Cl.

| H01L 29/78 | (2006.01) |
|---|---|
| H01L 27/108 | (2006.01) |
| H01L 29/06 | (2006.01) |
| G06N 3/04 | (2006.01) |
| H01L 29/45 | (2006.01) |
| G06N 3/063 | (2006.01) |
| H01L 29/08 | (2006.01) |

(52) U.S. Cl.
CPC ......... *H01L 29/7841* (2013.01); *G06N 3/049* (2013.01); *G06N 3/0635* (2013.01); *H01L 27/10802* (2013.01); *H01L 29/0676* (2013.01); *H01L 29/0847* (2013.01); *H01L 29/456* (2013.01); *H01L 29/7827* (2013.01)

(58) Field of Classification Search
CPC .......... H01L 29/7841; H01L 27/10802; H01L 27/11517–1156; G06N 3/02–105
See application file for complete search history.

(56) References Cited

U.S. PATENT DOCUMENTS

| 2008/0225588 A1 | 9/2008 | Jin |
|---|---|---|
| 2016/0064541 A1 | 3/2016 | Diaz |

FOREIGN PATENT DOCUMENTS

| KR | 10-2008-0083886 | 10/2013 |
|---|---|---|
| KR | 10-2016-0026613 | 9/2016 |
| KR | 10-2016-0063908 | 10/2016 |
| KR | 10-2019-0008065 | 4/2020 |

*Primary Examiner* — Amar Movva
(74) *Attorney, Agent, or Firm* — Nixon Peabody LLP

(57) ABSTRACT

A structure and an operation of a transistor, which is a vertical transistor in which a nanowire-type floating body layer is vertically formed or a horizontal transistor in which a floating body layer is horizontally formed, and implements a spike operation of a neuron by storing and releasing charges inside the transistor, and a neuromorphic system using the same are provided. The vertical transistor includes a floating body layer in a form of a vertical nanowire vertically formed on a substrate, a source and a drain formed above and below the floating body layer, a gate insulating layer formed on the source and surrounding the floating body layer, a gate formed outside the gate insulating layer, and a contact metal being in contact with the source, the drain and the gate to input or output an electrical signal.

14 Claims, 14 Drawing Sheets

STRUCTURE AND OPERATION METHOD OF TRANSISTOR ACTING AS A NEURON IN NEUROMORPHIC SYSTEM, AND A NEUROMORPHIC SYSTEM USING IT

CROSS-REFERENCE TO RELATED APPLICATIONS

A claim for priority under 35 U.S.C. § 119 is made to Korean Patent Application No. 10-2019-0067919 filed on 10 Jun. 2019 and 10-2020-0067970 filed on 5 Jun. 2020 in the Korean Intellectual Property Office, the entire contents of which are hereby incorporated by reference.

BACKGROUND

Embodiments of the inventive concept described herein relate to a structure and an operation method of a transistor acting as a neuron in a neuromorphic system and a neuromorphic system using the same.

In the fourth industrial revolution, research on artificial intelligence systems is actively being conducted. Among them, a neuromorphic computing system, which deviates from a conventional von Neumann method that consumes enormous energy, has attracted much attention.

The neuromorphic computing is a method of implementing artificial intelligence operations by imitating a human brain in hardware. The human brain performs a very complex function, but an energy consumed by the brain is only 20 to 25 W. Accordingly, the neuromorphic computing mimics a human brain structure itself to perform superior association, reasoning, inference, and data processing capabilities with ultra-low power than the conventional computing.

A neuromorphic chip operating the neuromorphic computing includes neurons and synapses in the same way that the human brain includes neurons and synapses connecting neurons. The neuron integrates a current signal transmitted from previous synapses and serves to transmit a spike-type voltage signal to a next synapse when a certain threshold is exceeded. In addition, the synapses perform potentiation or depression of spike intensity that the neurons express depending on a temporal correlation of spike to remember and learn connectivity.

In a case of the synapse, research on synaptic devices based on resistive random access memory (RRAM) or memristor has been conducted a lot. The memristor-based synapse is capable of being implemented as a two-terminal device and is very easy to integrate because a size of the memristor-based synapse is small.

However, the neuron, which is another component constituting the neuromorphic chip, is implemented as a complex circuit. Currently, the neuron is implemented by accumulating charge in a membrane capacitor and transfers the charge to a next synapse using a comparator circuit when the charge exceeds a threshold. Accordingly, currently, neurons occupy a layout area of up to 20000 $F^2$ and have limitation of integration. Ultimately, in a point that the brain has 100 billion neurons, improvement of density of neurons is key in terms of physical size and cost of the chip.

SUMMARY

Embodiments of the inventive concept provide a spike operation of a neuron in a neuromorphic system by storing and releasing charges in a vertical transistor in which a nanowire-type floating body layer is vertically formed.

In addition, embodiments of the inventive concept provide a spike operation of a neuron in a horizontal transistor, in which a floating body layer is horizontally formed, by storing and discharging charges in the floating body layer of the horizontal transistor. Accordingly, in the inventive concept a neuron including a complex circuit on a conventional neuromorphic chip may be implemented as a single transistor and integration and energy consumption of the neuromorphic chip may be greatly improved.

Meanwhile, the technical objects to be achieved in this specification are not limited to the aforementioned objects, and may be variously extended without departing from the technical spirit and scope of the inventive concept.

According to an exemplary embodiment, a vertical transistor acting as a neuron includes a floating body layer in a form of a vertical nanowire vertically formed on a substrate, a source and a drain formed above and below the floating body layer, a gate insulating layer formed on the source and surrounding the floating body layer, a gate formed outside the gate insulating layer, and a contact metal being in contact with the source, the drain and the gate to input or output an electrical signal.

The substrate may be formed of one of a silicon substrate, silicon (Si), silicon germanium (SiGe), strained Si, strained SiGe, silicon-on-insulator (SOI), silicon carbide (SiC), or a III-V compound semiconductor.

In the floating body layer, holes generated by impact ionization may be accumulated and the floating body layer may be formed of one of a silicon substrate, silicon (Si), silicon germanium (SiGe), strained Si, strained SiGe, silicon-on-insulator (SOI), silicon carbide (SiC), or a III-V compound semiconductor.

The floating body layer may have a nanowire or nanosheet structure.

The source and the drain may be formed of one of n-type silicon, p-type silicon, and metal silicide.

The source and the drain may have an asymmetric structure with different doping concentrations and different concentration gradients to block a sneak path of a neuron and synapse array.

The floating body layer, the source, and the drain may be formed by one of sequential ion implantation, solid-phase diffusion, epitaxial growth, and selective epitaxial growth.

The gate insulating layer may be formed of one of silicon oxide, a nitride layer, aluminum oxide, hafnium oxide, hafnium oxynitride, zinc oxide, zirconium oxide, hafnium zirconium (HZO), or any combination thereof.

The gate may have a structure of a gate-all-around or multiple-gate.

The gate may be formed of one of n-type polysilicon, p-type polysilicon, aluminum (Al), molybdenum (Mo), magnesium (Mg), chromium (Cr), palladium (Pd), platinum (Pt), nickel (Ni), titanium (Ti), gold (Au), tantalum (Ta), tungsten (W), silver (Ag), titanium nitride (TiN), tantalum nitride (TaN), or any combination metal thereof.

The contact metal may be formed of one of aluminum (Al), molybdenum (Mo), magnesium (Mg), chromium (Cr), palladium (Pd), platinum (Pt), nickel (Ni), titanium (Ti), gold (Au), tantalum Formed of one of (Ta), tungsten (W), silver (Ag), titanium nitride (TiN), tantalum nitride (TaN), or any combination metal thereof.

The vertical transistor may have a structure of an npn gate-less transistor or a pnp gate-less transistor of two terminals that does not include the gate insulating layer and the gate.

In the vertical transistor, when a current signal is applied from a previous synaptic device to the source or the drain, charges may be stored inside the vertical transistor, and when an amount of the stored charges exceeds a threshold, a spike-type voltage signal may be output from the source or the drain.

The vertical transistor may control spiking characteristics of the neuron in response to a voltage of the gate.

According to an exemplary embodiment, a method of operating a vertical transistor acting as a neuron includes inputting a current signal to a source or a drain from a previous synaptic device, storing charges by the current signal inside the transistor, and outputting a spike-type voltage signal from the source or drain when an amount of the stored charges exceeds a threshold value.

Holes generated by impact ionization may be accumulated in the floating body layer to allow a potential of the floating body layer to be lowered and when charges stored in the transistor becomes greater than or equal to a certain level, the charges may be released to allow the transistor to act as the neuron.

According to an exemplary embodiment, a neuromorphic system includes a neuromorphic chip that implements a neuron with a vertical transistor and the vertical transistor includes a floating body layer in a form of a vertical nanowire vertically formed on the substrate, a source and a drain formed above and below the floating body layer, a gate insulating layer formed on the source and surrounding the floating body layer, a gate formed outside the gate insulating layer, and a contact metal being in contact with the source, the drain and the gate to input or output an electrical signal.

The neuromorphic chip may further include an additional component of at least one of a resistor, a capacitor, another transistor, and an inverter in addition to the vertical transistor acting as the neuron.

The neuromorphic chip may include a synaptic device of one of the vertical transistor, a resistance change memory (RRAM) device, a memristor, a phase change memory (PCM) device, and a ferroelectric memory (FeRAM) device.

According to an exemplary embodiment, a transistor acting as a neuron includes a hole barrier material layer formed on a substrate, a floating body layer formed on the hole barrier material layer, a source and a drain formed on opposite sides of the floating body layer, a gate insulating layer formed on the floating body layer and surrounding the floating body layer, and a gate formed on the gate insulating layer.

The hole barrier material layer may formed of a buried oxide and a buried n-well for a p-type body, and may formed of a buried oxide and one of a buried p-well, a buried SiC, and a buried SiGe for an n-type body.

The floating body layer may store holes generated by impact ionization and have a variable doping concentration depending on characteristics of the neuron.

The floating body layer may be formed of one of silicon, germanium, silicon germanium, and a III-V compound semiconductor.

The floating body layer may have a structure one of a planar-type floating body layer, a fin-type floating body layer, and a nanowire-type floating body layer.

The substrate disposed below the planar-type floating body layer may be operates as a back gate.

The source and drain may be formed of one of n-type silicon, p-type silicon, and metal silicide.

The gate insulating layer may be formed of one of silicon oxide, nitride layer, aluminum oxide, hafnium oxide, hafnium oxide, zinc oxide, zirconium oxide, and hafnium oxide, hafnium zirconium oxide (HZO), or any combination thereof.

The gate may be formed of one of n-type polysilicon, p-type polysilicon, aluminum (Al), molybdenum (Mo), magnesium (Mg), chromium (Cr), palladium (Pd), platinum (Pt), nickel (Ni), titanium (Ti)), gold (Au), tantalum (Ta), tungsten (W), silver (Ag), titanium nitride (TiN), tantalum nitride (TaN), or any combination thereof.

The gate may have a structure of one of a planar gate, a fin gate, and a nanowire gate.

The horizontal transistor may have a structure of an npn gate-less transistor or a pnp gate-less transistor of two terminals that does not include the gate insulating layer and the gate.

The horizontal transistor may have a structure of a gate-all-around (GAA) transistor in which the gate insulating layer and the gate surround the floating body layer without the hole barrier material layer.

In the horizontal transistor, when a current signal is applied from a previous synaptic device to the source or the drain, charges may be stored inside the horizontal transistor to lower a potential of the floating body layer, and when an amount of the stored charges exceeds a threshold, a spike-type voltage signal may be output from the source or the drain.

According to an exemplary embodiment, a method of operating a horizontal transistor acting as a neuron includes inputting a current signal to a source or a drain from a previous synaptic device, storing charges by the current signal inside the transistor, and outputting a spike-type voltage signal from the source or drain when an amount of the stored charges exceeds a threshold value.

According to an exemplary embodiment, a neuromorphic system includes a neuromorphic chip that implements a neuron with a horizontal transistor and the horizontal transistor includes a hole barrier material layer formed on a substrate, a floating body layer formed on the hole barrier material, a source and a drain formed on opposite sides of the floating body layer, a gate insulating layer formed on the floating body layer and surrounding the floating body layer, and a gate formed on the gate insulating layer.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
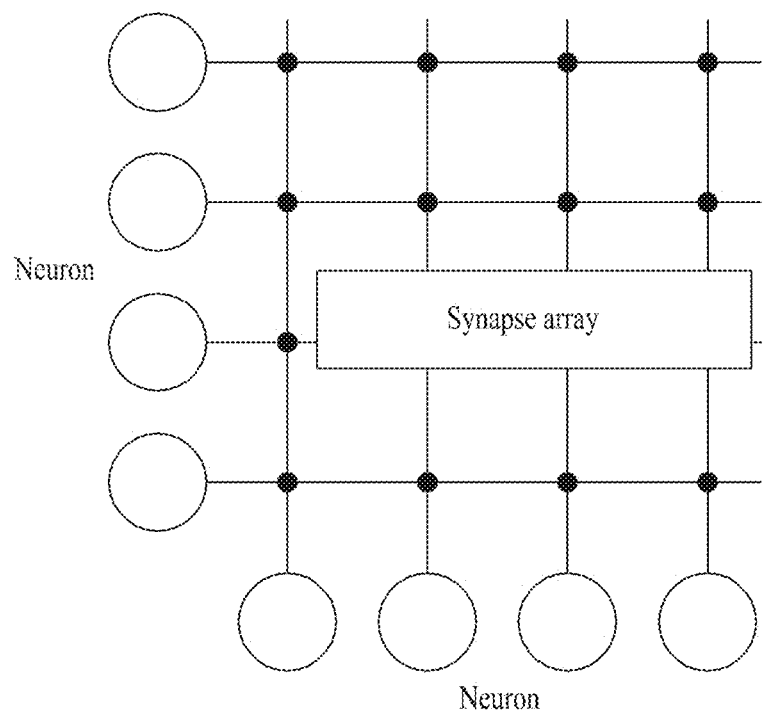
FIG. 1 is a diagram illustrating neurons and synapses on a neuromorphic chip.

Hereinafter, embodiments according to the inventive concept will be described in detail with reference to the accompanying drawings. However, the inventive concept is not limited or limited by the embodiments. In addition, like reference numerals may refer to like components throughout.

In addition terminologies used herein are defined to appropriately describe the embodiments of the inventive concept and thus may be changed depending on a user, the intent of an operator, or a custom in the field to which the inventive concept pertains. Accordingly, the terminologies must be defined based on the following overall description of this specification.

FIG. 1 is a diagram illustrating neurons and synapses on a neuromorphic chip.

Referring to FIG. 1, a neuron integrates a current signal transmitted from previous synapses and serves to transmit a spike-type voltage signal to a next synapse when an amount of charges exceeds a certain threshold. Here, the synapses perform potentiation or depression of spike intensity that the neurons express depending on a temporal correlation of spike to remember and learn connectivity.

According to an embodiment, the synapse may be configured as one of a resistance change memory (RRAM) device, a memristor, a phase change memory (PCM) device, and a ferroelectric memory (FeRAM) device.

A neuromorphic system according to an embodiment of the inventive concept may use a neuromorphic chip including a vertical transistor acting as a neuron and the neuromorphic chip may further include one of a resistor, a capacitor, another transistor, and an inverter in addition to the vertical transistor acting as the neuron.

In addition, the neuromorphic system according to an embodiment of the inventive concept may use the neuromorphic chip including the vertical transistor acting as the neuron and a synaptic device of one of a resistance change memory (RRAM) device, a memristor, a phase change memory (PCM) device, and a ferroelectric memory (FeRAM) device.

Figure 2A:
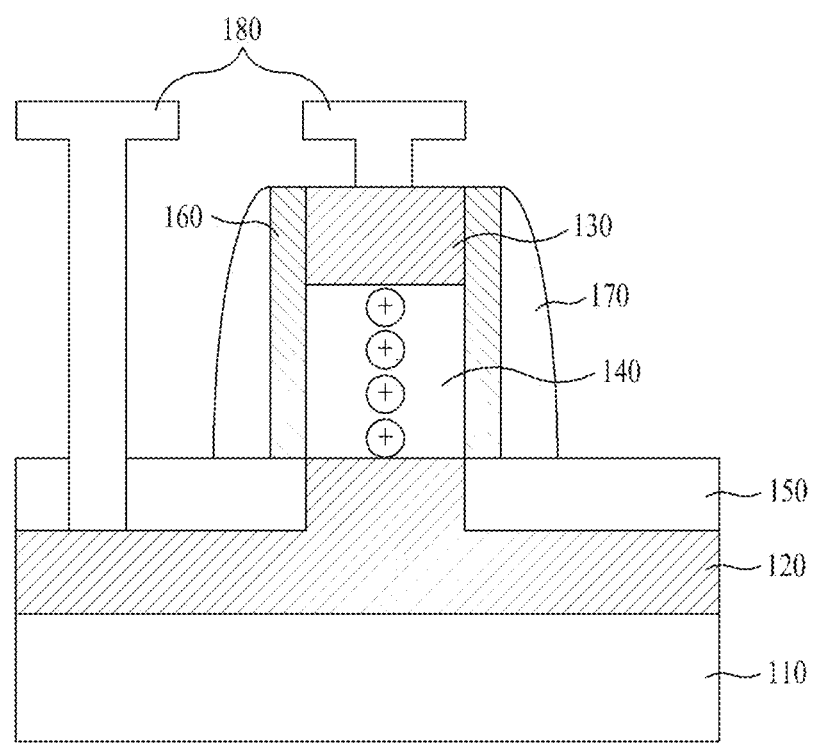
FIGS. 2A and 2B are cross-sectional views of a vertical transistor according to an embodiment of the inventive concept.
Figure 2B:
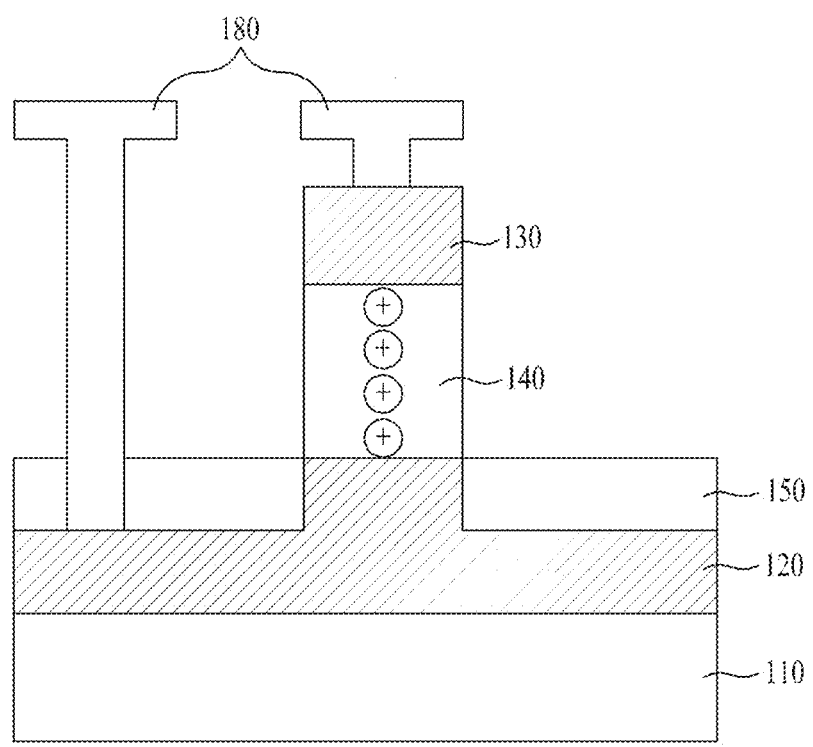

FIGS. 2A and 2B are cross-sectional views of a vertical transistor according to an embodiment of the inventive concept.

In detail, FIG. 2A is a cross-sectional view of a vertical transistor, which acts as a neuron and includes a gate according to an embodiment of the inventive concept and FIG. 2B is a cross-sectional view of a vertical transistor, which acts as a neuron and does not include a gate.

Referring to FIG. 2A, a vertical transistor 100 according to an embodiment of the inventive concept includes a substrate 110, a floating body layer 140, a source 120, a drain 130, an insulating layer 150, a gate insulating layer 160, a gate 170, and a contact metal 180.

The substrate 110, which is a substrate supporting the floating body layer 140 in a form of a vertical nanowire, may be formed of one of a silicon substrate, silicon (Si), silicon germanium (SiGe), strained Si, strained SiGe, a silicon-on-insulator (SOI), silicon carbide (SiC), or a group III-V compound semiconductor.

The floating body layer 140 has a vertical nanowire shape formed vertically on the substrate 110.

The floating body layer 140 of the vertical transistor according to an embodiment of the inventive concept enables neurons to be released when charges stored in the transistor becomes greater than or equal to a certain level and a doping concentration thereof may vary depending to characteristics of a desired neuron. The floating body layer 140 may be formed of one of a silicon substrate, silicon (Si), germanium (Ge), silicon germanium (SiGe), strained Si, strained SiGe, silicon-on-insulator (SOI), silicon carbide (SiC), or a group III-V compound semiconductor.

In addition, the floating body layer 140 may have a structure of a nanowire or a nanosheet.

A floating body or the floating body layer generally refers to a channel of a three-electrode transistor (gate, source, drain) rather than a channel of an electric field transistor based on a 4-electrode (gate, source, drain, body). Typically, the floating body or the floating body layer is widely used in a device on the silicon-on-insulator (SOI) substrate. In this case, the gate on the channel may adjust a channel potential of an upper portion or a part of the channel exposed through the very thin gate insulating layer. However, because a lower portion of the channel is adjacent to a buried oxide, it is difficult to adjust the potential of the lower portion of the channel due to the very thick buried oxide layer when a voltage is applied through a back-gate, which is the SOI substrate. Therefore, the SOI device is not capable of effectively controlling the potential at the lower portion of the channel, resulting in an undesirable floating body effect.

Meanwhile, the general four-electrode based electric field transistor may apply a voltage to the body to fundamentally block the effect of the floating body. In the more broad concept, an isolated channel of a device in which a nanowire or a nanosheet is surrounded by a gate-all-around may also be a floating body because a separate voltage cannot be applied to the body. However, in this case, the effect of the floating body may be alleviated because the channel potential is well controlled by the gate due to the gate surrounding the channel front and the very thin gate insulating layer.

Unlike a typical horizontal device, a vertical pillar-type device is formed on a bulk silicon (bulk-Si) substrate and appears to have no floating body, but it is not. For example, in a case of a p-type body, a channel is isolated by vertically arranged n+ source and n+ drain, and in the case of the n-type body, the channel is isolated by vertically arranged p+ source and p+ drain, thereby forming the floating body structure. Similarly, the channel is electrically insulated from the bulk silicon substrate by a buried SiC or a buried SiGe under the vertical pillar, thereby forming the floating body.

In the inventive concept, the body of the vertical pillar-type nanowire is expressed as a floating body in that it is geometrically suspended. Specifically, among structures proposed in the inventive concept, FIG. 2A illustrates a front gate electrode to allow the vertical pillar-type nanowire to become a floating body geometrically but to allow it to become a quasi-floating body that is electrically controlled with a channel potential, well. FIG. 2B has no gate electrode to allow the vertical pillar-type nanowire to become a floating body both geometrically and electrically. However, in the inventive concept, for the sake of generalization, the vertical pillar-type nanowire in both cases is expressed and described as the floating body (or floating body layer 140).

Referring back to FIG. 2A, the source 120 and the drain 130 of the vertical transistor according to an embodiment of the inventive concept are formed above and below the floating body layer 140, respectively.

When a current signal is input from previous synapses to the source 120 and the drain 130 of the vertical transistor according to an embodiment of the inventive concept, charges are stored in the source 120 and the drain 130. A voltage between the source 120 and the drain 130 increases as an amount of stored charges increase and the increased voltage is above a threshold to generate impact ionization. Here, generated holes are stored in the floating body layer 140 to lower the potential of the floating body layer 140, thereby generating single transistor latch phenomenon. As the charges stored in the source 120 or the drain 130 instantaneously release by the single transistor latch phenomenon, a spike-type voltage signal may be output to the source 120 or the drain 130. Here, positions of the source 120 and the drain 130 may be changed depending on cases. In some embodiments, the source 120 may act as a drain, and the drain 130 may act as a source.

The source 120 and the drain 130 may be formed of one of n-type silicon, p-type silicon and metal silicide. Here, the source 120 and the drain 130 may be doped with a different type from the floating body layer 140.

The source 120 and the drain 130 may represent an asymmetric structure with different doping concentrations to be used to block a sneak path of a neuron and synapse array. In detail, the source 120 and the drain 130 represent the asymmetric structure of different doping concentrations, and have characteristics that current flows only in one direction. Particularly, in the inventive concept, the structure of the source 120 and the drain 130 may be implemented as a cross-point array but the sneak path between adjacent neurons or synapses may be effectively blocked without a separate selector due to the asymmetric structure, thereby dramatically increasing integration.

The source 120 and the drain 130 of the vertical transistor according to an embodiment of the inventive concept may have a different type from the floating body layer 140. For example, when the source 120 and drain 130 are p-type, the floating body layer 140 may be n-type and when the source 120 and drain 130 are n-type, the floating body layer 140 may be p-type.

A process of forming the floating body layer 140 in the form of the vertical nanowire, the source 120, and the drain 130 according to an embodiment of the inventive concept may be formed using one of a sequential ion implantation, solid-state diffusion (solid-phase diffusion), epitaxial growth, and selective epitaxial growth.

Figure 3:
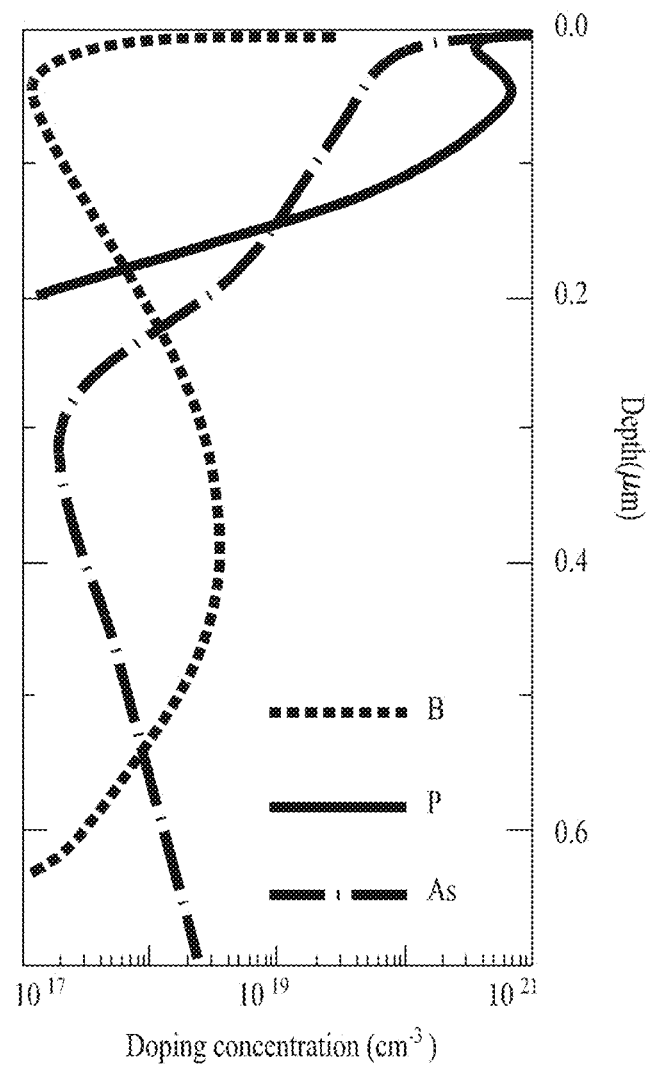
FIG. 3 is a graph illustrating a doping concentration for a depth of a vertical nanowire according to an embodiment of the inventive concept as a graph.

Here, a process of forming the floating body layer 140, the source 120, and the drain 130 through ion implantation and nanowire etching is as follows. For example, in a case of an n-type transistor, n-type, p-type and n-type are sequentially doped from the substrate 110 through the sequential ion implantation and in a case of a p-type transistor, p-type, n-type and p-type are sequentially doped from the substrate 110. Thereafter, a vertical nanowire pillar may be formed through an etching process and a lower layer of the vertical nanowire pillar may be formed as the source 120, a meddle layer of the vertical nanowire pillar may be formed as the floating body layer 140, and an upper layer of the vertical nanowire pillar may be as the drain 130. A doping concentration for a depth in the vertical nanowire formed through above-described process may represent an asymmetric distribution as shown in FIG. 3. However, according to an embodiment, the above-described etching process and ion implantation process may be reversed in some cases.

Further, the solid-phase diffusion is a doping method in which a solid-state doped source of one of silicate glass, polymer, and self-assembling monolayers (SAM) is deposited on a target and then a dopant is diffused through a sequential annealing process. The solid-phase diffusion may be relatively free from non-conformal doping or damage that occurs during the ion implantation. In particular, there are many advantages when the solid-phase diffusion is applied because it is difficult to be doped at the lower portion of the target in the form of the vertical nanowire through the ion implantation In addition, the epitaxial growth is a process of growing a layer having the same crystal structure as a semiconductor substrate on the semiconductor substrate and includes physical vapor deposition (PVD), chemical vapor deposition (CVD), metal-organic chemical vapor deposition (MOCVD), and atomic layer deposition (ALD). The selective epitaxial growth is a process of exposing only a certain region of a semiconductor substrate and growing a layer having the same crystal structure in the exposed region. Accordingly, in-situ doping using the epitaxial growth process or the selective epitaxial growth process may form the source 120 having n-type, the floating body layer 140 having p-type, and the drain 130 having n-type, respectively.

The insulating layer 150 may serve to electrically insulate the gate 170 and the source 120. According to an embodiment, the insulating layer 150 may be formed of a material forming the gate insulating layer 160.

The gate insulating layer 160 is formed on the source and surrounds the floating body layer 140.

The gate insulating layer 160 may insulate the floating body layer 140 and the gate 170 and may be formed of one of silicon oxide, nitride layer, aluminum oxide, hafnium oxide, hafnium oxynitride, zinc oxide, zirconium oxide, hafnium zirconium oxide (HZO), or any combination thereof.

The gate 170 is formed on the outer side of the gate insulating layer 160.

The gate 170 may be formed after the gate insulating layer 160 and may serve to determine neuron characteristics through potential adjustment of the floating body layer 140. Here, the gate 170 may be formed of one of n-type polysilicon, p-type polysilicon, or metal, and the metal may be formed of one of aluminum (Al), molybdenum (Mo), magnesium (Mg), chromium (Cr), Palladium (Pd), platinum (Pt), nickel (Ni), titanium (Ti), gold (Au), tantalum (Ta), tungsten (W), silver (Ag), titanium nitride (TiN), tantalum nitride (TaN)), or any combination thereof.

In addition, the gate 170 may have the structure of a gate-all-around or a multiple gate.

When a doping concentration of the floating body layer 140 is greater than or equal to a certain value ($1 \times 10^{17}$ cm$^{-3}$), the gate insulating layer 160 and the gate 170 of the vertical transistor 100 according to an embodiment of the inventive concept may not be necessary. In this case, the vertical transistor 100 may become a structure of an npn gate-less transistor or a pnp gateless of a 2-terminal that does not include the gate insulating layer 160 and the gate 170 and the above-described structure may be as shown in FIG. 2B.

The contact metal 180 contacts the source 120, the drain 130, and the gate 170 to input or output an electrical signal.

The contact metal 180 may input or output the electrical signal to the source 120, the drain 130 and the gate 170 and may be formed of one of aluminum (Al), molybdenum (Mo), magnesium (Mg), chromium (Cr), palladium (Pd), platinum (Pt), nickel (Ni), titanium (Ti), gold (Au), tantalum (Ta), tungsten (W), silver (Ag), titanium nitride (TiN), tantalum nitride (TaN), or any combination thereof.

The vertical transistor according to an embodiment of the inventive concept may control spiking characteristics of the neuron in response to the voltage of the gate 170.

In the vertical transistor according to an embodiment of the inventive concept, when a current signal is applied from a previous synaptic device to the source 120 or the drain 130, charges may be stored in the transistor. When the amount of stored charges is greater than or equal to the threshold, the voltage signal in a form of the spike may be output from the source 120 or the drain 130.

A method of operating the vertical transistor according to an embodiment of the inventive concept will be described with reference to FIG. 4 below.

Figure 4:
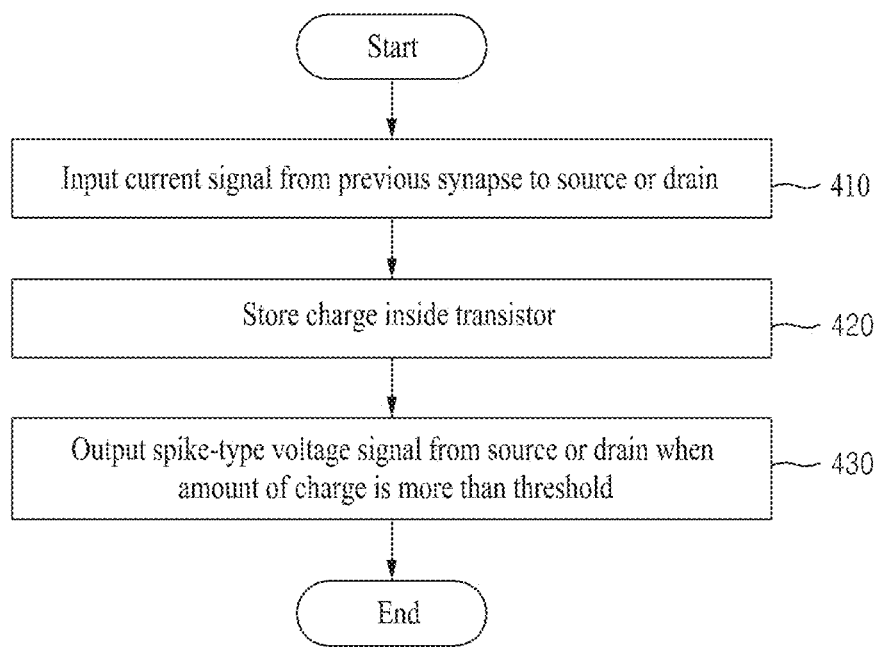
FIG. 4 is a flowchart illustrating a method of operating a vertical transistor according to an embodiment of the inventive concept.

FIG. 4 is a flowchart illustrating a method of operating a vertical transistor according to an embodiment of the inventive concept.

A method of FIG. 4 is performed by the vertical transistor according to an embodiment of the invention shown in FIGS. 2A and 2B.

Referring to FIG. 4, the current signal is input to the source or the drain from the previous synaptic device in 410.

Charges by the current signal are stored inside the transistor in 420. Subsequently, when the amount of stored charges exceeds the threshold, the voltage signal in the form of the spike is output from the source or the drain in 430.

As a detailed description of operations 420 and 430, the charges inputted by the current signal are stored in the source or the drain, the voltage between the source and the drain increases as the amount of stored charges increase, and the increased voltage is above the threshold to generate impact ionization. Here, the generated holes may be stored in the floating body layer to lower the potential of the floating body layer and the charges stored in the source or the drain may be instantaneously released by the single transistor latch phenomenon to output the spike-type voltage signal to the source or the drain.

When the vertical transistor according to the embodiment of the inventive concept acts as the neuron through the above-described operations, an appropriate voltage should be applied to the gate. Meanwhile, when the doping concentration of the floating body layer in the vertical transistor is greater than or equal to a predetermined value ($1 \times 10^{17}$ $cm^{-3}$), the vertical transistor may act as the neuron in a floating state where no voltage is applied to the gate.

When the vertical transistor according to the embodiment of the inventive concept acts as the neuron through the above-described operations, an addition component of one of resistor, capacitor, transistor, and inverter may be included in a limited region of input and output terminals in the vertical transistor acting as the neuron.

Figure 5A:
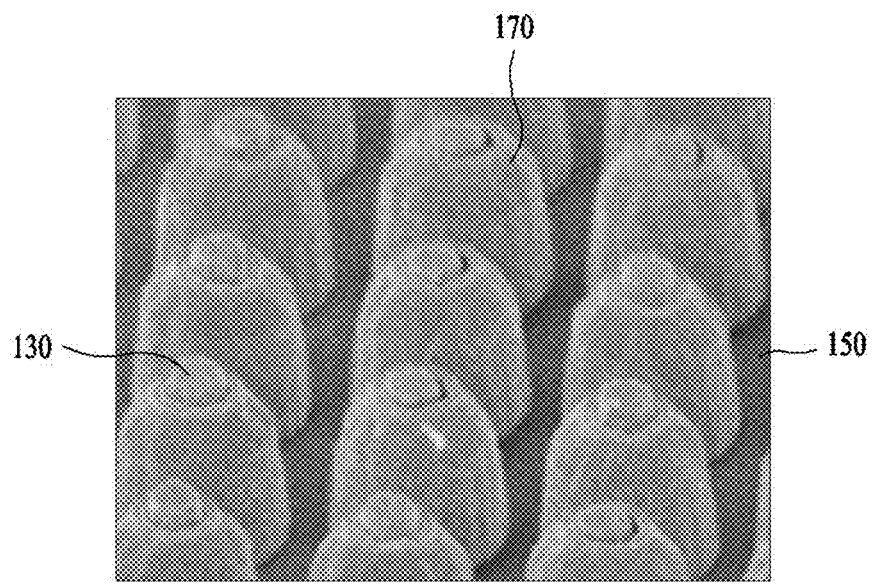
FIGS. 5A and 5B illustrate electron microscope images of a vertical transistor according to an embodiment of the inventive concept.
Figure 5B:
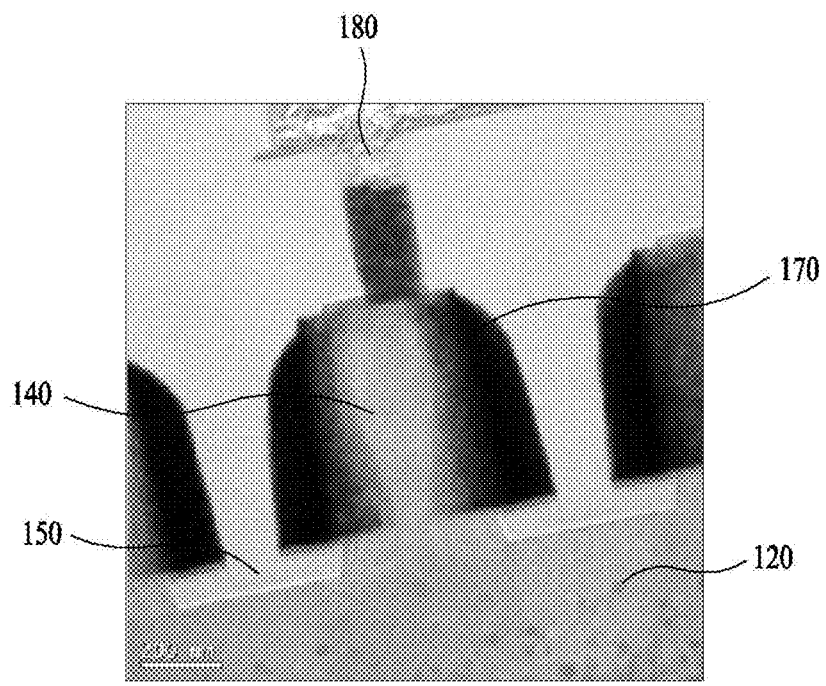

FIGS. 5A and 5B illustrate electron microscope images of a vertical transistor according to an embodiment of the inventive concept.

In detail, FIGS. 5A and 5B may show cross-sections of FIG. 2A and may confirm a vertical transistor acting as the neuron, which includes the source 120, the drain 130, the floating body layer 140, the insulating layer 150, the gate 170, and the contact metal 180 and is actually manufactured according to an embodiment of the inventive concept.

Referring to FIG. 5A, a scanning electron microscopy (SEM) image of a surface structure of the vertical transistor acting as the neuron, which includes the drain 130, the insulating layer 150, and the gate 170 according to an embodiment of the inventive concept may be confirmed.

Referring to FIG. 5B, a transmission electron microscope (TEM) image of a cross-sectional structure of the vertical transistor acting as the neuron, which includes the source 120, the floating body layer 140, the insulating layer 150, the gate 170, and the contact metal 180 according to an embodiment of the inventive concept may be confirmed.

Figure 6:
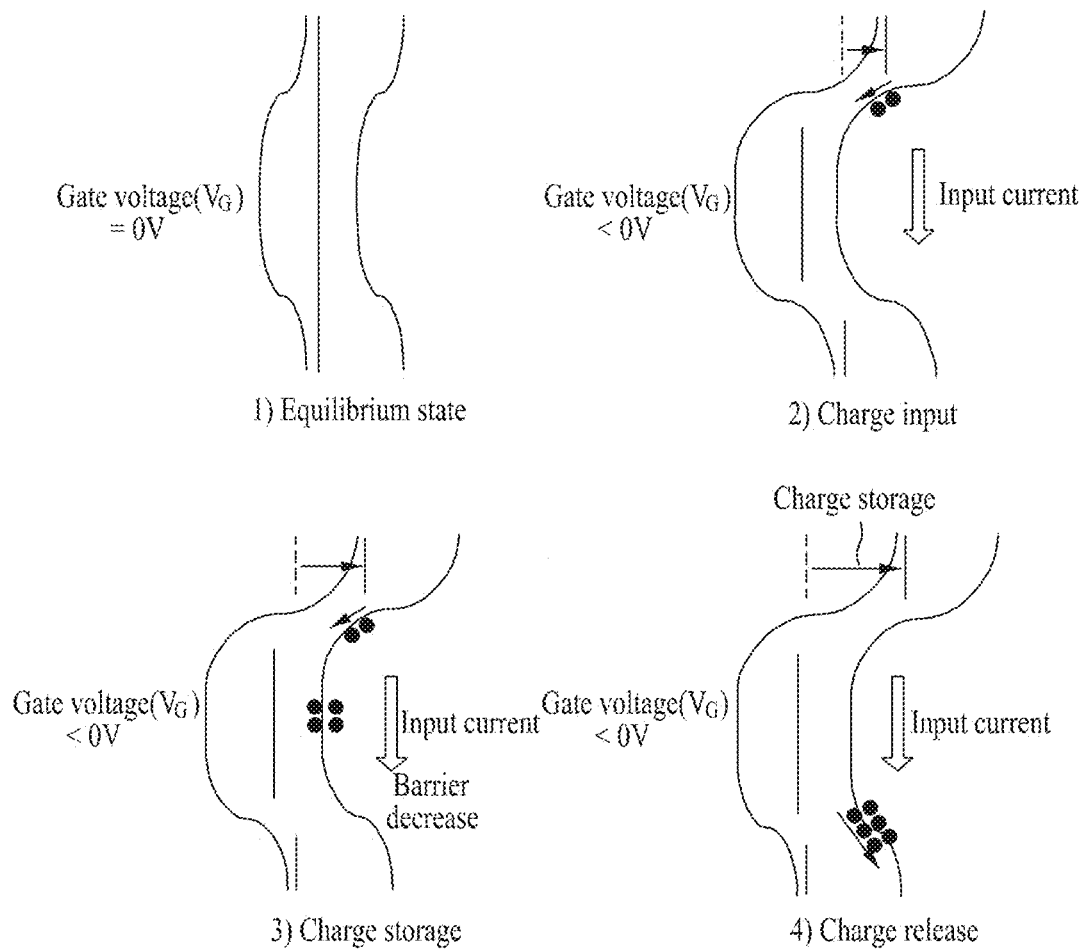
FIG. 6 illustrates an energy band diagram for explaining a method of operating a vertical transistor according to an embodiment of the inventive concept.

FIG. 6 illustrates an energy band diagram for explaining a method of operating a vertical transistor according to an embodiment of the inventive concept.

Referring to 1) of FIG. 6, it may be seen that there is no additional charge in the source 120 or the drain 130 and the holes generated by the impact ionization in the floating body layer 140 in an equilibrium state where no voltage (0V) is applied to the gate 170 and no current signal is input to the source 120 or the drain 130.

As shown in 2) of FIG. 6, the current signal may be input to the source 120 or the drain 130 from the previous synapses in a state in which a negative voltage (<0V) is applied to the gate 170. As shown in 3) of FIG. 6, the additional charges in the source 120 or the drain 130 and the holes generated by the impact ionization may be stored in the floating body layer 140.

Accordingly, the potential of the floating body layer 140 is lowered by holes. As shown in 4) of FIG. 6, the charges stored in the source 120 or the drain 130 are released due to the single transistor latch phenomenon to output the voltage signal to the source 120 or the drain 130.

Figure 7:
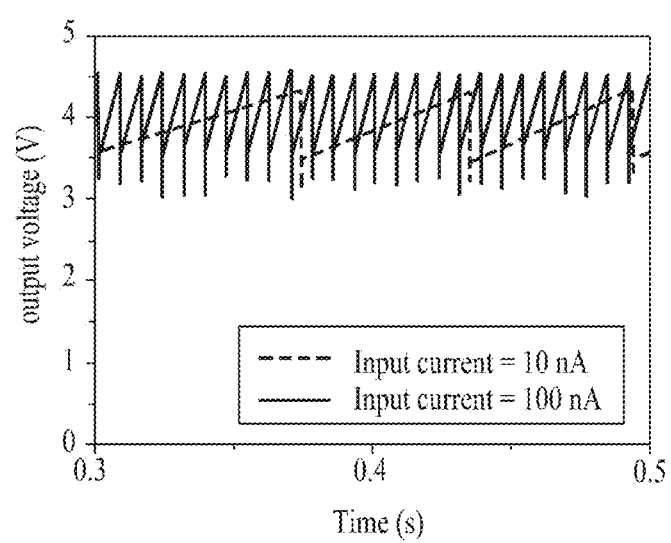
FIG. 7 illustrates a graph of results for neuron characteristics of a vertical transistor according to an embodiment of the inventive concept.

FIG. 7 illustrates a graph of results for neuron characteristics of a vertical transistor according to an embodiment of the inventive concept.

Referring to FIG. 7, it may be seen that the vertical transistor acting as the neuron, which is manufactured according to an embodiment of the inventive concept exhibits neuron characteristics and the output voltage exhibits a spike shape over time.

Here, an experiment of FIG. 7 was measured directly in a vertical transistor having a source length of 200 nm, a floating body layer length of 300 nm, a drain length of 200 nm, and a vertical nanowire diameter of 400 nm and a voltage of −1V was applied to the gate to allow the vertical transistor to act as the neuron.

Figure 8A:
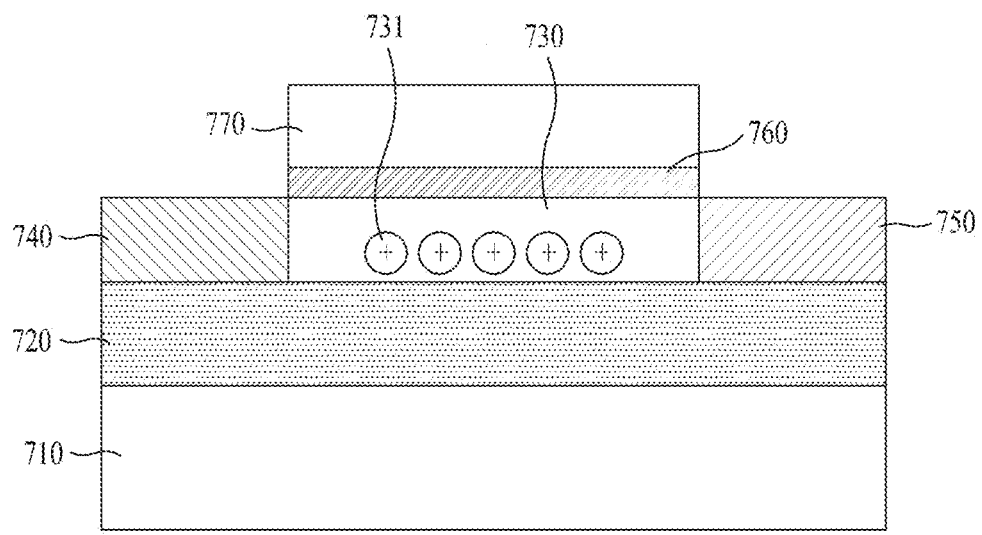
FIGS. 8A and 8B are cross-sectional views of a horizontal transistor according to an embodiment of the inventive concept.
Figure 8B:
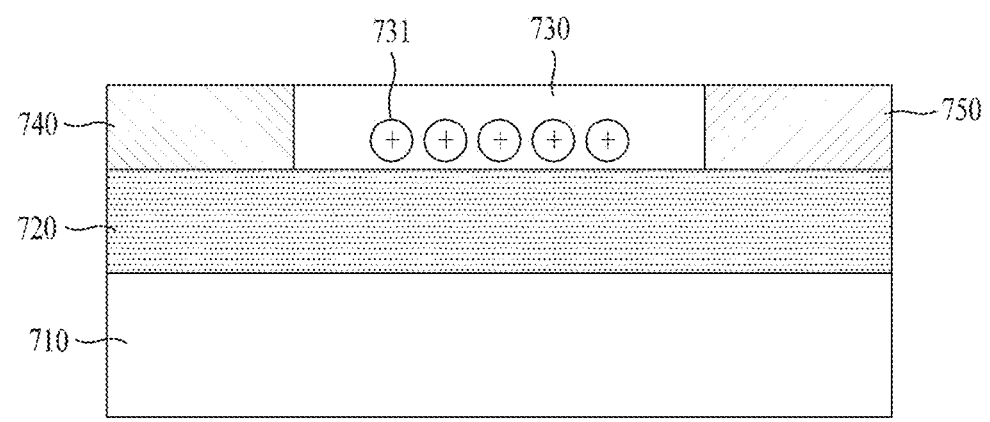

FIGS. 8A and 8B are cross-sectional views of a horizontal transistor according to an embodiment of the inventive concept.

In detail, FIG. 8A illustrates a cross-sectional view of a horizontal transistor acting a neuron with a gate according to an embodiment of the inventive concept and FIG. 8B illustrates a cross-sectional view of a horizontal transistor acting a neuron without a gate according to an embodiment of the inventive concept.

Referring to FIG. 8A, a horizontal transistor 100 according to an embodiment of the inventive concept includes a substrate 710, a hole barrier material layer 720, a floating body layer 730, a source 740, a drain 750, a gate insulating layer 760, and a gate 770.

The substrate 710 may function as a back gate applying a voltage bias, and the hole barrier material layer 720 and the floating body layer 730 may be sequentially disposed on the substrate 710.

The substrate 710 represents a single crystal semiconductor substrate, and may be formed of one of a silicon substrate, silicon germanium, tensile silicon, tensile silicon germanium, and silicon carbide substrate.

The hole barrier material layer 720 may be formed of a buried oxide and a buried n-well for a p-type body, and may be formed of a buried oxide and one of a buried n-well, a buried SiC, and a buried SiGe for a p-type body.

The floating body layer 730 is formed on the hole barrier material layer 720.

The floating body layer 730 may be formed of a semiconductor and have variable doping concentration depending on characteristics of the neuron. In addition, the floating body layer 730 may be formed of one of silicon, germanium, silicon germanium, and a III-V compound semiconductor.

According to an embodiment, the floating body layer 730 may be formed in a form of one of a flat type floating body layer, a fin type floating body layer, and a nanowire type floating body layer. Here, when the floating body layer 730 is planar, the substrate 710 disposed under the planar floating body layer 730 may function as a back gate.

The sources and drain 740 and 750 are formed on opposite sides of the floating body layer.

The source and drain 740 and 750 may be formed of one of n-type silicon, p-type silicon, and metal silicide.

The source and drain 740 and 750 according to an embodiment of the inventive concept may be formed through diffusion or ion implantation and subsequent heat treatment. When a current signal is input from previous synapses and the charges 731 are accumulated over a certain level, a spike-type voltage signal may be output to the source 740 or the drain 750.

The gate insulating layer 760 is formed on the floating body layer 730 to surround the floating body layer 730.

The gate insulating layer 760 may insulate the floating body layer 730 and the gate 770 and may be formed of one of silicon oxide, nitride layer, aluminum oxide, hafnium oxide, oxynitride hafnium oxynitride, zinc oxide, zirconium oxide, hafnium zirconium oxide (HZO), or any combination thereof.

The gate 770 is formed on the gate insulating layer 760.

The gate 770 may serve to determine the neuron characteristics through the potential adjustment of the floating body layer 730, be formed of one of n-type polysilicon, p-type polysilicon, or metal, and the metal may be formed of one of aluminum (Al), molybdenum (Mo), magnesium (Mg), chromium (Cr), palladium (Pd), platinum (Pt), nickel (Ni), titanium (Ti), gold (Au), tantalum (Ta), tungsten (W), silver (Ag), tin (TiN), tantalum nitride (TaN), or any combination thereof.

According to an embodiment, the gate 770 may be one of a planar gate, a fin gate, and a nanowire gate.

When a doping concentration of the floating body layer 730 is greater than or equal to a certain value ($5\times10^{17}$ cm$^3$), the gate insulating layer 760 and the gate 770 according to an embodiment of the inventive concept may not be necessary. In this case, the horizontal transistor may become a structure of an npn gate-less transistor or a pnp gateless of a 2-terminal that does not include the gate insulating layer 760 and the gate 770 and the above-described structure may be as shown in FIG. 8B.

The horizontal transistor according to an embodiment of the inventive concept may be a structure of a gate-all-around (GAA) transistor in which the gate insulating layer 760 and the gate 770 surround the floating body layer 730. In this case, the charge 731 may be trapped without a barrier material, and thus the hole barrier material layer 720 may not be required.

In the horizontal transistor according to an embodiment of the inventive concept, when a current signal is applied to the source 740 or the drain 750 from the previous synaptic device, the charge may be stored in the source 740 or the drain 750 and holes generated by impact ionization may be stored in the floating body layer 730. Accordingly, the potential of the floating body layer 730 may be lowered and the charges stored in the source 740 or the drain 750 may be released by the single transistor latch phenomenon to output a voltage signal in a form of a spike from the source 740 or the drain 750.

A method of operating the horizontal transistor according to the embodiment of the inventive concept will be described with reference to FIG. 9 below.

Figure 9:
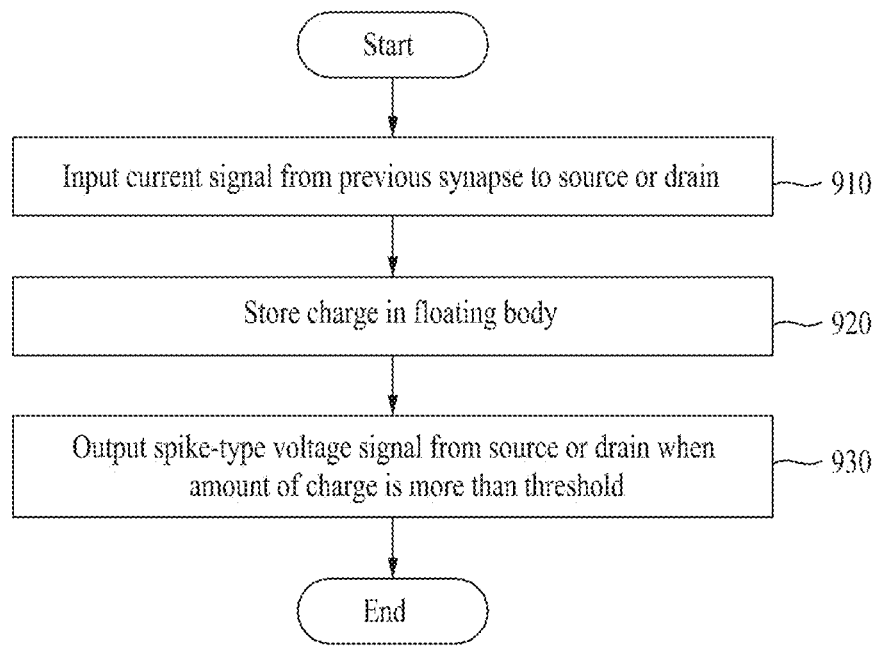
FIG. 9 is a flowchart illustrating a method of operating a horizontal transistor according to an embodiment of the inventive concept.

FIG. 9 is a flowchart illustrating a method of operating a horizontal transistor according to an embodiment of the inventive concept.

The method of FIG. 9 is performed by the horizontal transistor according to embodiments of the invention of FIGS. 8A and 8B.

Referring to FIG. 9, a current signal is input to a source or a drain from a previous synaptic device in 910.

Charges by the current signal are stored in the source and the drain in 920. Subsequently, when the amount of stored charges exceeds a threshold, a voltage signal in a form of a spike is output from the source or the drain in 930.

When the horizontal transistor according to the embodiment of the inventive concept acts as the neuron through the above-described operations, an appropriate voltage should be applied to the gate. Meanwhile, when the doping concentration of the floating body layer in the horizontal transistor is greater than or equal to a predetermined value ($5\times10^{17}$ cm$^{-3}$), the horizontal transistor may act as the neuron in a floating state where no voltage is applied to the gate.

When the horizontal transistor according to the embodiment of the inventive concept acts as the neuron through the above-described operations, an additional component of one of resistor, capacitor, transistor, and inverter may be included in a limited region of input and output terminals in the horizontal transistor acting as the neuron.

Figure 10A:
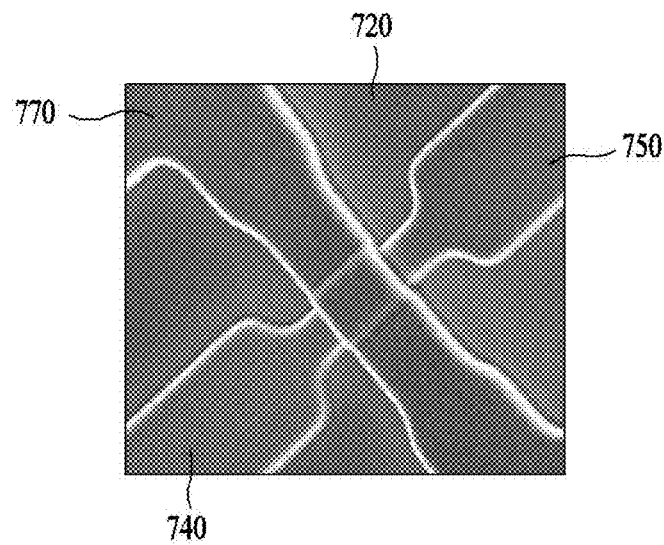
FIGS. 10A and 10B illustrate electron microscope images of a horizontal transistor according to an embodiment of the inventive concept.
Figure 10B:
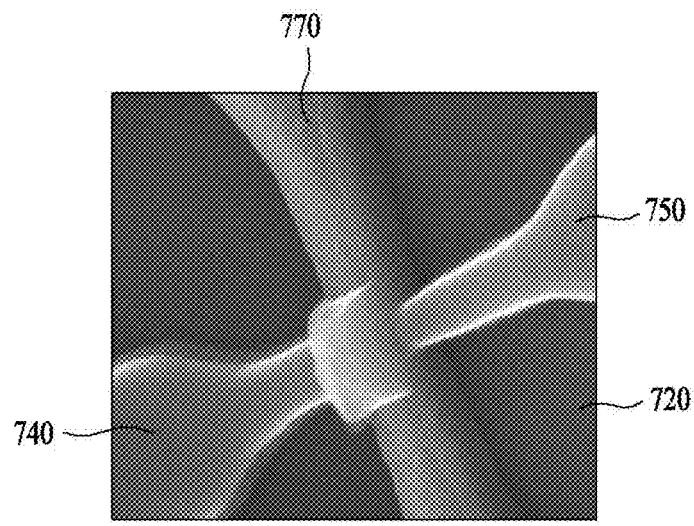

FIGS. 10A and 10B illustrate electron microscope images of a horizontal transistor according to an embodiment of the inventive concept.

In detail, FIGS. 10A and 10B illustrate cross-sections of FIG. 8A and the horizontal transistor which includes the hole barrier material layer 720, the source 740, the drain 750, and the gate 770 and acts as the neuron according to an embodiment of the inventive concept may be confirmed.

Referring to FIG. 10A, an electron microscope image of the horizontal transistor which includes the floating body layer 730 having the planar-type structure and the gate 770 and acts as the neuron according to an embodiment of the inventive concept may be confirmed.

In addition, referring to FIG. 10B, an electron microscope image of the horizontal transistor which includes the floating body layer 730 having the fin-type structure and the gate 770 and acts as the neuron according to an embodiment of the inventive concept may be confirmed.

Figure 11:
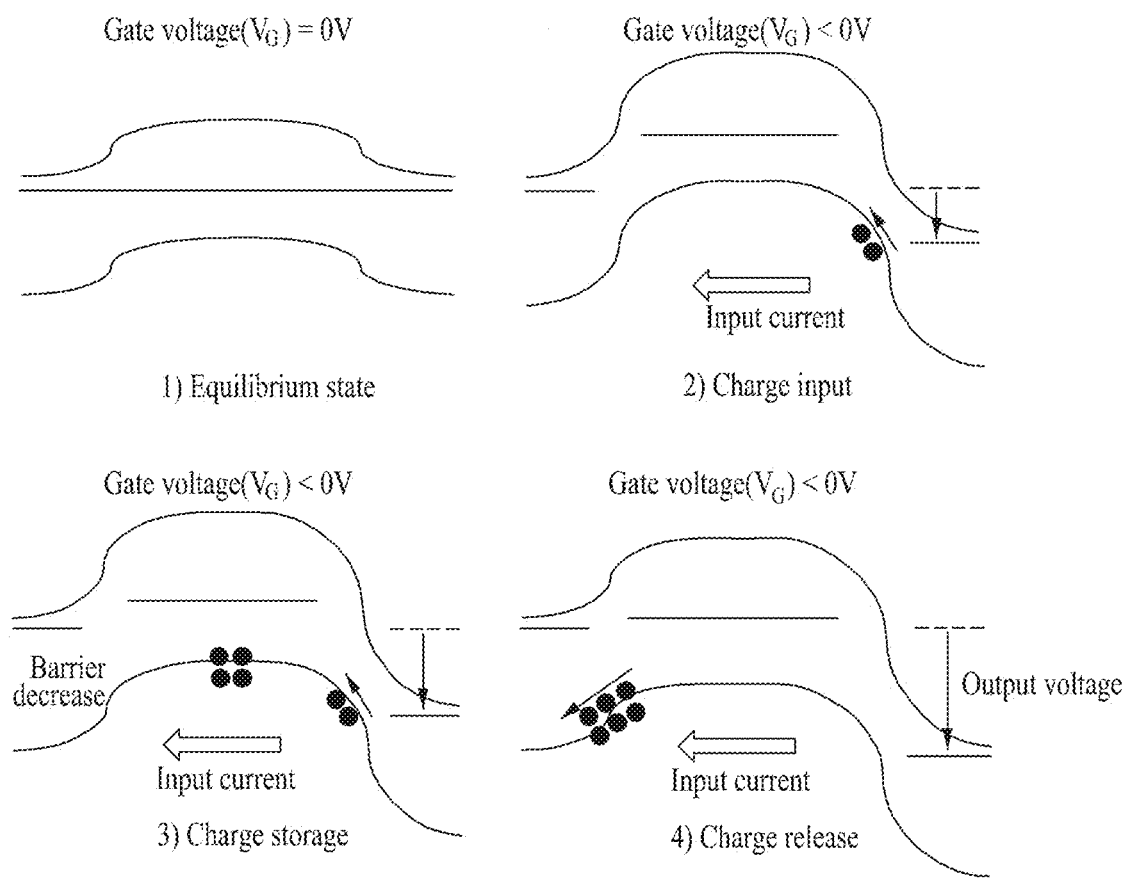
FIG. 11 illustrates an energy band diagram for explaining a method of operating a horizontal transistor according to an embodiment of the inventive concept.

FIG. 11 illustrates an energy band diagram for explaining a method of operating a horizontal transistor according to an embodiment of the inventive concept.

Referring to 1) of FIG. 11, it may be seen that there is no additional charge in the floating body layer 730, the source 740, or the drain 750 in an equilibrium state where no voltage (0V) is applied to the gate 770 and no current signal is input to the source 740 or the drain 750.

As illustrated in 2) of FIG. 11, the current signal may be input to the source 740 or the drain 750 from the previous synapses in a state in which a negative voltage (<0V) is applied to the gate 770. As shown in 3) of FIG. 11, charges may be stored in the source 740 and the drain 750 and holes generated by the single transistor latch phenomenon may be stored in the floating body layer 730.

Accordingly, the potential of the floating body layer 140 is lowered. As shown in 4) of FIG. 11, when the amount of the charges stored is greater than or equal to the threshold, the charges are released and the spike-type voltage signal may be output to the source 740 or the drain 750.

Figure 12A:
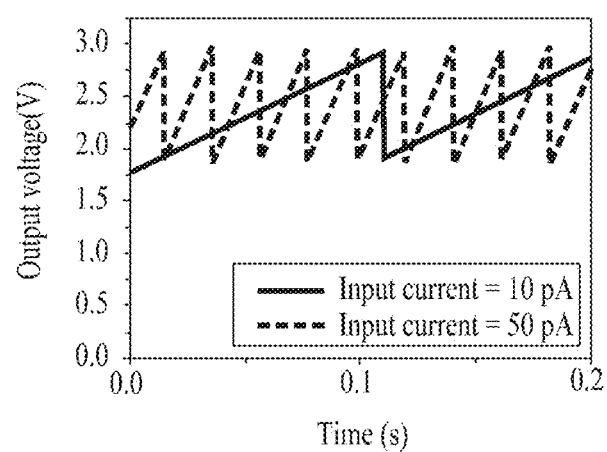
FIGS. 12A and 12B illustrate graphs of results for neuron characteristics of a horizontal transistor according to an embodiment of the inventive concept.
Figure 12B:
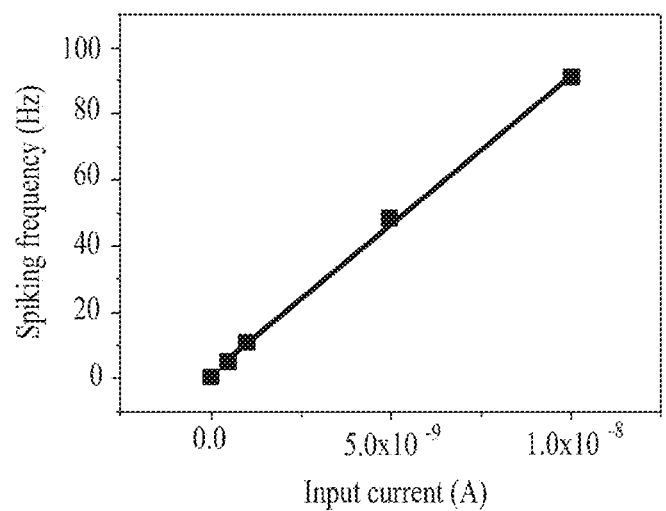

FIGS. 12A and 12B illustrate graphs of results for neuron characteristics of a horizontal transistor according to an embodiment of the inventive concept.

In detail, FIG. 12A is a graph showing results of spiking operation of a horizontal transistor according to an embodiment of the inventive concept and FIG. 12B is a graph showing spiking frequency characteristics of an output voltage in response to an input current of a horizontal transistor according to an embodiment of the inventive concept.

Referring to FIG. 12A, it may be seen that the output voltage over time in the horizontal transistor according to an embodiment of the inventive concept exhibits a spike shape. In addition, referring to FIG. 12B, it may be seen that the horizontal transistor according to an embodiment of the inventive concept exhibits characteristics of a typical neuron in which the spiking frequency increases linearly as the input current increases.

Here, an experiment of FIGS. 12A and 12B was measured directly on the horizontal transistor including a planar floating body layer and a gate structure having a gate length of 640 nm, a gate width of 930 nm, and a floating body layer of 50 nm, and −1V voltage was applied to the gate to allow the horizontal transistor to act as the neuron.

According to an embodiment of the inventive concept, the charges may be stored inside the vertical transistor to greatly improve the density because it is not necessary to accumulate the charges in the external capacitor called the membrane capacitor of the conventional neuron. In addition, when the amount of stored charges exceeds the certain threshold, the stored charges may be automatically released, and thus there be no need for the existing comparator circuit or the circuit for adjusting the potential. Therefore, according to an embodiment of the inventive concept, the neurons may be operated only with the single vertical transistor and the neuronal integration on the neuromorphic chip can be improved to a minimum of 4 $F^2$ by the advantage of the vertical transistors with vertically formed the source, body (floating body layer), and drain.

In addition, according to an embodiment of the inventive concept, the structure of the vertical transistor in which the gate surrounds the nanowire-type floating body layer allows the charges to be stored in the floating body layer without the hole barrier material such as the oxide. Therefore, there is no need to be formed on the silicon-on-insulator (SOI) substrate, which has a great advantage in terms of process complexity and cost compared to the planar transistor.

According to an embodiment of the inventive concept, the charges may be stored inside the horizontal transistor to greatly improve the density because it is not necessary to accumulate the charges in the external capacitor called the membrane capacitor of the conventional neuron. In addition, when the amount of stored charges exceeds the certain threshold, the stored charges may be automatically released, and thus there may be no need for the existing comparator circuit or the circuit for adjusting the potential. Therefore, the neurons may be operated only with the single horizontal transistor and the neuronal integration on the neuromorphic chip may be greatly improved to the level of 6 $F^2$ or less.

However, the effects of the inventive concept are not limited to the above effects, and may be variously extended without departing from the technical spirit and scope of the inventive concept.

While the inventive concept has been described with reference to exemplary embodiments, it will be apparent to those skilled in the art that various changes and modifications may be made without departing from the spirit and scope of the inventive concept. For example, suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. A vertical transistor acting as a neuron, the vertical transistor comprising:
   a floating body layer in a form of a vertical nanowire vertically formed on a substrate;
   a source and a drain formed above and below the floating body layer;
   a gate insulating layer formed on the source and surrounding the floating body layer;
   a gate formed outside the gate insulating layer; and
   a contact metal being in contact with the source, the drain and the gate to input or output an electrical signal.

2. The vertical transistor of claim 1, wherein the substrate is formed of one of a silicon substrate, silicon (Si), silicon germanium (SiGe), strained Si, strained SiGe, silicon-on-insulator (SOI), silicon carbide (SiC), or a III-V compound semiconductor.

3. The vertical transistor of claim 2, wherein the floating body layer has a nanowire or nanosheet structure.

4. The vertical transistor of claim 1, wherein in the floating body layer, holes generated by impact ionization are accumulated and the floating body layer is formed of one of a silicon substrate, silicon (Si), silicon germanium (SiGe), strained Si, strained SiGe, silicon-on-insulator (SOI), silicon carbide (SiC), or a III-V compound semiconductor.

5. The vertical transistor of claim 1, wherein the source and the drain are formed of one of n-type silicon, p-type silicon, and metal silicide.

6. The vertical transistor of claim 5, wherein the source and the drain have an asymmetric structure with different doping concentrations and different concentration gradients to block a sneak path of a neuron and synapse array.

7. The vertical transistor of claim 1, wherein the floating body layer, the source, and the drain are formed by one of sequential ion implantation, solid-phase diffusion, epitaxial growth, and selective epitaxial growth.

8. The vertical transistor of claim 1, wherein the gate insulating layer is formed of one of silicon oxide, a nitride layer, aluminum oxide, hafnium oxide, hafnium oxynitride, zinc oxide, zirconium oxide, hafnium zirconium (HZO), or any combination thereof.

9. The vertical transistor of claim 1, wherein the gate has a structure of a gate-all-around or multiple-gate.

10. The vertical transistor of claim 9, wherein the gate is formed of one of n-type polysilicon, p-type polysilicon, aluminum (Al), molybdenum (Mo), magnesium (Mg), chromium (Cr), palladium (Pd), platinum (Pt), nickel (Ni), titanium (Ti), gold (Au), tantalum (Ta), tungsten (W), silver (Ag), tin (TiN), tantalum nitride (TaN), or any combination metal thereof.

11. The vertical transistor of claim 1, wherein the contact metal is formed of one of aluminum (Al), molybdenum (Mo), magnesium (Mg), chromium (Cr), palladium (Pd), platinum (Pt), nickel (Ni), titanium (Ti), gold (Au), tantalum Formed of one of (Ta), tungsten (W), silver (Ag), titanium nitride(TiN), tantalum nitride (TaN), or any combination metal thereof.

12. The vertical transistor of claim 1, wherein the vertical transistor has a structure of an npn gate-less transistor or a pnp gate-less transistor of two terminals that does not include the gate insulating layer and the gate.

13. The vertical transistor of claim 1, wherein, in the vertical transistor, when a current signal is applied from a previous synaptic device to the source or the drain, charges are stored inside the vertical transistor, and when an amount of the stored charges exceeds a threshold, a spike-type voltage signal is output from the source or the drain.

14. The vertical transistor of claim 1, wherein the vertical transistor controls spiking characteristics of the neuron in response to a voltage of the gate.

* * * * *